US012779836B2

(12) United States Patent
Shin et al.

(10) Patent No.: US 12,779,836 B2
(45) Date of Patent: Nov. 3, 2026

(54) MANUFACTURING METHOD OF SEMICONDUCTOR PACKAGE

(71) Applicant: SAMSUNG ELECTRONICS CO., LTD., Suwon-si (KR)

(72) Inventors: YongChul Shin, Suwon-si (KR); Minwoo Rhee, Suwon-si (KR); Sujie Kang, Suwon-si (KR); Sun-woo Park, Suwon-si (KR); Nungpyo Hong, Suwon-si (KR); Kyeongbin Lim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 359 days.

(21) Appl. No.: 18/622,040

(22) Filed: Mar. 29, 2024

(65) Prior Publication Data

US 2025/0070079 A1 Feb. 27, 2025

(30) Foreign Application Priority Data

Aug. 25, 2023 (KR) ........................ 10-2023-0111659

(51) Int. Cl.
*B32B 43/00* (2006.01)
*H10P 54/00* (2026.01)
*H10W 80/00* (2026.01)

(52) U.S. Cl.
CPC ............ *B32B 43/006* (2013.01); *H10P 54/00* (2026.01); *H10W 80/211* (2026.01); *H10W 80/312* (2026.01); *H10W 80/327* (2026.01)

(58) Field of Classification Search
CPC .... B32B 43/006; H10P 54/00; H10W 80/211; H10W 80/312; H10W 80/327
See application file for complete search history.

(56) References Cited

U.S. PATENT DOCUMENTS

| | | | | |
|---|---|---|---|---|
| 9,773,660 | B2 | 9/2017 | Kim et al. | |
| 10,186,447 | B2 | 1/2019 | Ekkels et al. | |
| 10,658,182 | B2 | 5/2020 | Budd et al. | |
| 10,872,802 | B2 | 12/2020 | Chang et al. | |
| 2014/0106649 | A1 | 4/2014 | Kim et al. | |
| 2016/0268226 | A1 | 9/2016 | Lim et al. | |
| 2018/0158712 | A1 | 6/2018 | Ekkels et al. | |
| 2019/0148207 | A1 | 5/2019 | Chang et al. | |
| 2019/0378720 | A1 | 12/2019 | Budd et al. | |
| 2020/0321307 | A1 * | 10/2020 | Uzoh | H10P 54/00 |
| 2021/0343591 | A1 | 11/2021 | Lin et al. | |
| 2022/0148993 | A1 | 5/2022 | Kim et al. | |

* cited by examiner

*Primary Examiner* — Samuel A Gebremariam
(74) *Attorney, Agent, or Firm* — Sughrue Mion, PLLC

(57) ABSTRACT

A semiconductor package manufacturing method includes: bonding a carrier to a wafer; dicing the wafer together with the carrier which is bonded to the wafer into a plurality of die-carrier assemblies, each of the plurality of die-carrier assemblies including a die and a carrier piece bonded to the die; disposing the plurality of die-carrier assemblies on a target substrate; and separating the carrier pieces from the plurality of die-carrier assemblies by irradiating the plurality of die-carrier assemblies with light.

20 Claims, 13 Drawing Sheets

MANUFACTURING METHOD OF SEMICONDUCTOR PACKAGE

CROSS-REFERENCE TO RELATED APPLICATION

This application claims priority to and the benefit of Korean Patent Application No. 10-2023-0111659 filed in the Korean Intellectual Property Office on Aug. 25, 2023, the disclosure of which is incorporated by reference herein in its entirety.

BACKGROUND

The present disclosure relates generally to a semiconductor package manufacturing method.

For packaging of semiconductor devices, a silicon wafer that has gone through a series of manufacturing processes is attached to a carrier, then a back grinding process is performed, and the thinned silicon wafer is separated into individual dies through a dicing process. The dies are mounted on a target substrate using pick and place equipment.

Recently, the die mounted on the substrate continues to become thinner in order to achieve low power and high performance in semiconductor packages. As the die becomes thinner and wider, warpage increases, causing problems in die handling.

In particular, due to the increasing demand for high performance packages with high input/output density, instead of solder bumps, copper-$SiO_2$ hybrid bonding technology is attracting attention in die-die or die-wafer bonding. In the die used for hybrid bonding, a metal pad, which is an interconnection portion, is exposed, and thus there is a risk of causing damage to the die when using an existing pick and place method.

SUMMARY

One or more example embodiments provide a semiconductor package manufacturing method that may easily handing a thin die.

According to an aspect of an example embodiment, a semiconductor package manufacturing method includes: bonding a carrier to a wafer; dicing the wafer together with the carrier which is bonded to the wafer into a plurality of die-carrier assemblies, each of the plurality of die-carrier assemblies including a die and a carrier piece bonded to the die; disposing the plurality of die-carrier assemblies on a target substrate; and separating the carrier pieces from the plurality of die-carrier assemblies by irradiating the plurality of die-carrier assemblies with light.

According to an aspect of an example embodiment, a semiconductor package manufacturing method includes: bonding a carrier to a front side of a wafer, the carrier including a material configured to transmit light; grinding a rear side of the wafer that is opposite to the front side of the wafer; dicing the wafer together with the carrier which is bonded to the wafer into a plurality of die-carrier assemblies, each of the plurality of die-carrier assemblies including a die and a carrier piece bonded to the die; disposing the plurality of die-carrier assemblies on a target substrate; and separating the carrier pieces from the plurality of die-carrier assemblies by irradiating the plurality of die-carrier assemblies with light.

According to an aspect of an example embodiment, a semiconductor package manufacturing method includes: bonding a first carrier to a first side of a wafer; grinding a second side of the wafer, which is opposite to the first side of the wafer; bonding a second carrier to the second side of the wafer, the second carrier including a material configured to transmit light; removing the first carrier; dicing the wafer together with the second carrier which is bonded to the wafer into a plurality of die-carrier assemblies, each of the plurality of die-carrier assemblies including a die and a carrier piece bonded to the die; disposing the plurality of die-carrier assemblies on a target substrate; and separating the carrier pieces from the plurality of die-carrier assemblies by irradiating the plurality of die-carrier assemblies with light.

BRIEF DESCRIPTION OF THE DRAWINGS

The above and other aspects and features will be more apparent from the following description of one or more example embodiments taken in conjunction with the accompanying drawings, in which.

DETAILED DESCRIPTION

Figure 1:
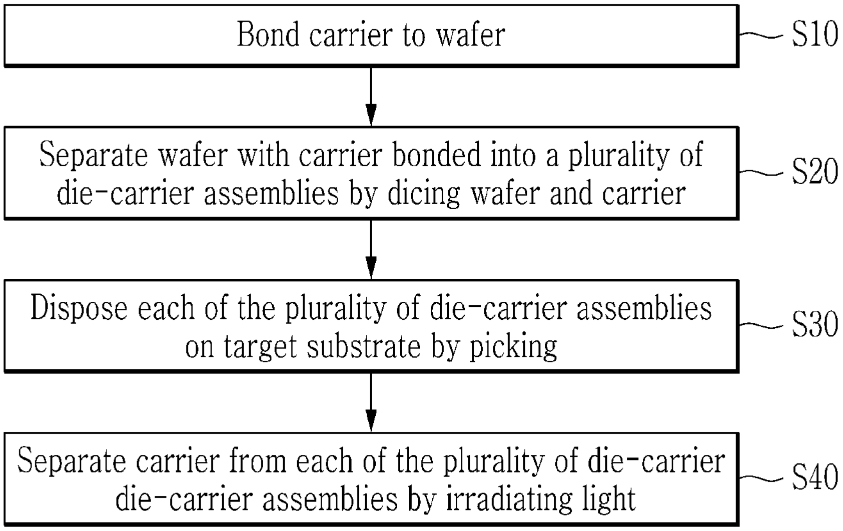
FIG. 1 is a flowchart of a semiconductor package manufacturing method according to one or more example embodiments.

Hereinafter, with reference to the accompanying drawings, example embodiments of the present disclosure will be described in detail.

As those skilled in the art will realize, the described embodiments may be modified in various different ways, without departing from the spirit or scope of the present disclosure.

The drawings and description are to be regarded as illustrative in nature and not restrictive. Like reference numerals designate like elements throughout the specification.

In addition, the size and thickness of each component shown in the drawings are arbitrarily indicated for convenience of description and thus embodiments of the present disclosure is not necessarily limited to what is shown.

Throughout this specification and the claims that follow, when it is described that an element is "coupled" to another element, it includes not only "directly connected", but also "indirectly connected" with other members between the element and the another element. In addition, unless explicitly described to the contrary, the word "comprise", and variations such as "comprises" or "comprising", will be understood to imply the inclusion of stated elements but not the exclusion of any other elements.

It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, when an element is "on" a reference portion, the element is located above or below the reference portion, and it does not necessarily mean that the element is located "on" the another element in a direction opposite to gravity.

Further, throughout the specification, when it is referred to as "planar", it means the case where a target part is viewed from above, and when it is referred to as "in a cross-section", it means the case where a cross-section obtained by vertically cutting the target part is viewed from the side.

Hereinafter, referring to the drawings, a semiconductor package manufacturing method according to one or more example embodiments will be described.

A semiconductor package manufacturing method according to one or more example embodiments may facilitate handling of ultra-thin dies. One or more example embodiments are characterized in that a carrier and a wafer are diced together in a bonded state. In addition, one or more example embodiments are characterized in that the carrier can be easily separated from the wafer by irradiating the carrier and the wafer that are bonded with light to weaken the adherence between the carrier and the wafer.

Referring to FIG. 1, to sequentially describe the semiconductor package manufacturing method of one or more example embodiments, first, the carrier is bonded to the wafer (S10), and the wafer to which the carrier is bonded is diced together with the carrier, thereby separating into a plurality of die-carrier assemblies (S20). Each of the separated plurality of die-carrier assemblies are arranged on a target substrate by picking (S30) and the plurality of die-carrier assemblies are irradiated with light to separate a carrier from each of the plurality of die-carrier assemblies (S40).

As described, in one or more example embodiments, the wafer to which the carrier is bonded is diced together with the carrier, the carrier is placed on a target substrate in a bonded state, and then the carrier is separated. Accordingly, even when a thickness of the die separated from the wafer is very thin, the die can be easily handled. In addition, warpage can be prevented when handling thin-thickness dies.

According to one or more example embodiments, the carrier may include a material that transmits light. Additionally, during bonding between the wafer and the carrier, an adhesive member that reacts with light and weakens adherence may be used. Accordingly, the carrier can be easily separated from the wafer by irradiating the die-carrier assemblies with light to weaken the adherence of the adhesive member.

Hereinafter, referring to the drawings, a semiconductor package manufacturing method according to one or more example embodiments will be described in detail.

FIGS. 2, 3, 4, 5, 6, 7, 8 and 9 are provided for description of a semiconductor package manufacturing method according to one or more example embodiments. In FIGS. 2, 3, 4, 5, 6, 7, 8 and 9, FIG. 5 is a top plan view, and FIGS. 2, 3, 4, 6, 7, 8 and 9 are cross-sectional views. In this specification, for better comprehension, some size, thickness, length, and the like, shown in the drawings may be exaggerated or reduced.

Figure 2:
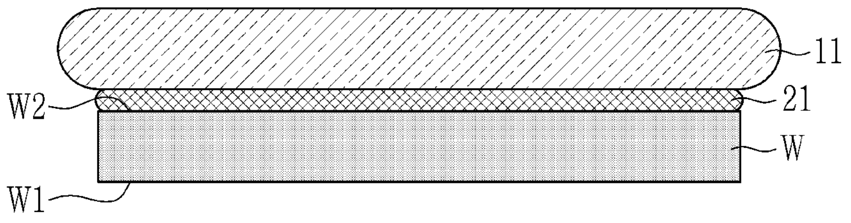
FIGS. 2, 3, 4, 5, 6, 7, 8 and 9 are provided for description of a semiconductor package manufacturing method according to one or more example embodiments.

Referring to one or more example embodiments shown in FIG. 2, a first carrier 11 is bonded to a wafer W (S10).

According to one or more example embodiments, a first adhesive member 21 is disposed between the wafer W and the first carrier 11 to bond the wafer W and the first carrier 11.

The wafer W may have a first side W1 and an opposite second side W2. For example, the first carrier 11 may be bonded to the second side W2 of the wafer W. The first carrier 11 may cover the entire surface of the second side W2 of the wafer W.

The first carrier 11 may include a material that transmits first light. The material of the first carrier 11 may vary depending on the type of first light. For example, the first carrier 11 may include glass or silicon. Glass may transmit most light, including ultra-violet (UV) light, and silicon may transmit infra-red (IR) light in a specific wavelength band.

The first adhesive member 21 may be disposed on the first carrier 11 and thus the first carrier 11 may be bonded on the second side W2 of the wafer W. The first adhesive member 21 may be disposed on the first carrier 11 in the form of a tape. Alternatively, according to one or more example embodiments, the first adhesive member 21 may be disposed on the first carrier 11 in a paste form through a method such as spin coating.

According to one or more example embodiments, the adherence of the first adhesive member 21 may be weakened by reacting with the first light. Accordingly, the adherence of the first adhesive member 21 may be weakened or lost by irradiating the first adhesive member 21 with the first light. More specifically, the first adhesive member 21 may lose or weaken its adherence by reacting to light of a specific wavelength or temperature.

For example, according to one or more example embodiments, the first adhesive member 21 may include UV release tape or UV release paste that loses or weakens adherence by reacting to UV light. Alternatively, according to one or more example embodiments, the first adhesive member 21 may include a thermal release tape or thermal release paste that reacts with IR light or heat corresponding to IR light. However, the first adhesive member 21 is not limited thereto, and, according to one or more example embodiments, the first adhesive member 21 may include various components reacting with the first light of a specific wavelength.

Figure 3:
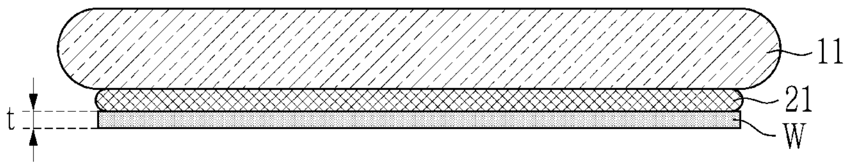

Referring to one or more example embodiments shown in FIG. 3, before proceeding with a dicing process (according to one or more example embodiments, separation into a plurality of die-carrier assemblies), the wafer W may be grinded. By grinding, the thickness of the wafer W may be processed to be thin. For example, the first side W1 opposite to the second side W2 to which the wafer W is bonded may be grinded. The grinding may be carried out using a chemical mechanical polishing (CMP) device.

After grinding, a semiconductor process such as a photo, etching, deposition, or metal wiring process may be carried out on the first side W1 of the wafer W.

Referring to one or more example embodiments shown in FIG. 3, according to one or more example embodiments, before the dicing process is carried out, a thickness t of the wafer W may be 30 μm. When the thickness of the wafer W is less than 30 μm, a problem that warpage increases may occur when handling the wafer W and individual dies after dicing. To address this, according to one or more example embodiments, the first carrier 11 may be diced together with the wafer W bonded and disposed on the target substrate.

Referring to one or more example embodiments shown in FIG. 4, to perform dicing, a wafer to which the first carrier 11 is bonded is placed on a dicing member 60 (hereinafter, a carrier+wafer structure will be defined as a wafer assembly).

The dicing member 60 includes a frame portion 61 and an adhesive portion 62. The adhesive portion 62 may have adhesive properties to secure the wafer assembly. In addition, the adhesive portion 62 may have elasticity and may be deformed as the frame portion 61 is driven. For example, the adhesive portion 62 may be stretched or bent.

A first protective tape 71 may be attached to one side (i.e., the first side W1 of the wafer) of the wafer assembly to protect the side contacting the adhesive portion 62. In one or more example embodiments, one side (i.e., first side W1 of the wafer) of the wafer assembly is fixed to the adhesive portion 62, but in one or more example embodiments, the other side (top side of the first carrier), which is opposite to one side of the wafer assembly, may be fixed to the adhesive portion 62. However, as in one or more example embodiments, when the carrier portion is exposed in the wafer assembly, when handling separate individual dies after dicing, it may be advantageous to handle them through the carrier portion.

Figure 4:
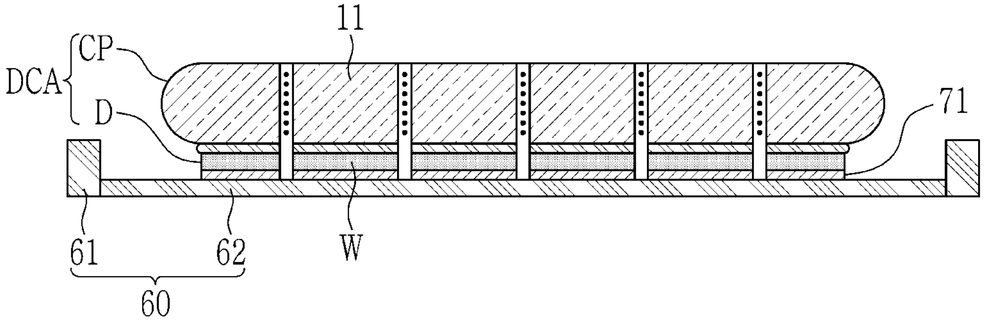
Figure 5:
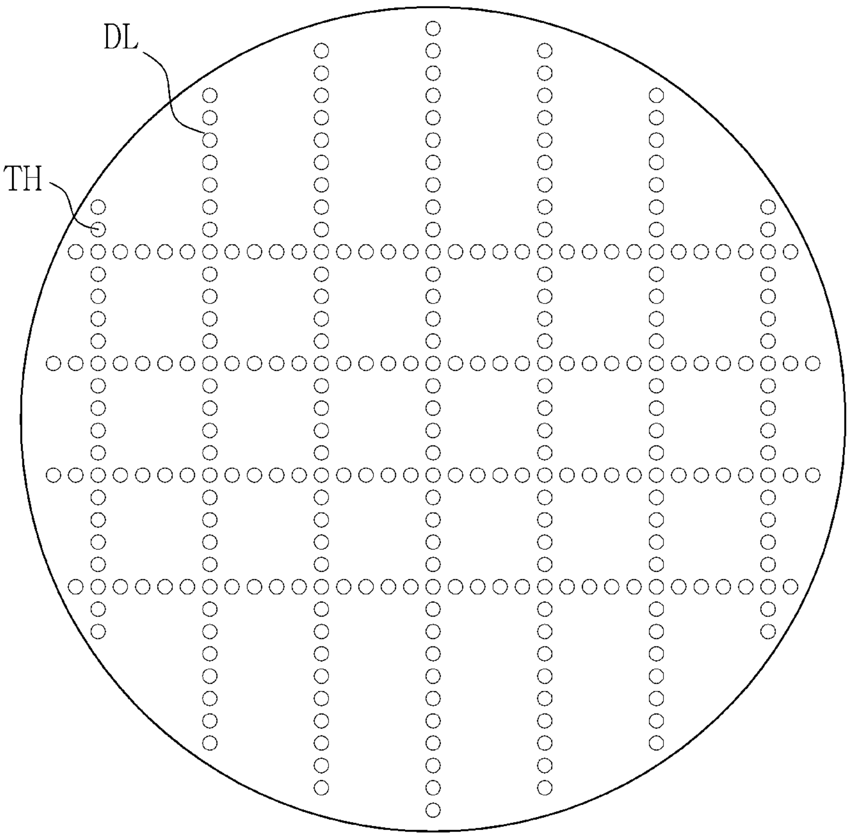
Figure 6:
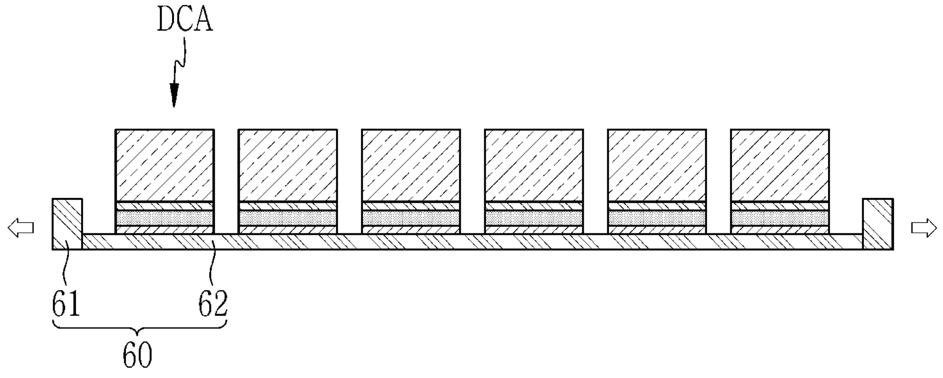

Referring to one or more example embodiments shown in FIG. 4, the wafer assembly may be separated into a plurality of dies through dicing (S20).

More specifically, the wafer W to which the first carrier 11 is bonded may be diced together and separated into a plurality of structures in which a carrier piece CP is bonded to a die D. In the present specification, a structure in which the carrier piece CP is bonded to the die D may be defined as a die-carrier assembly. That is, the die-carrier assembly DCA includes a die D and a carrier piece CP bonded to the die D.

According to one or more example embodiments, the wafer assembly may be separated into a plurality of die-carrier assemblies using at least one of a blade, a laser, and plasma. The first carrier 11 and the wafer W in the wafer assembly may be diced first using the same method or a different method. Depending on the position attached to the dicing member 60, the first carrier 11 may be diced first in the wafer assembly. Alternatively, the wafer W may be diced first in the wafer assembly.

For example, when the first carrier 11 includes a glass material, the first carrier 11 may be diced using a laser. Because the glass material is brittle, a plurality of through-holes may be formed in the first carrier 11 using laser ablation. Referring to one or more example embodiments shown in FIG. 5, a plurality of through-holes TH may be formed along a path DL to be diced, and the first carrier 11 may remain in a state of not being completely separated into the plurality of carrier pieces CP. Additionally, for convenience in separation of the first carrier 11, and etching solution (etchant) may be sprayed to the first carrier 11 to perform an etching process. As another example, the first carrier 11 may be diced using a blade or plasma.

Subsequently, the wafer W may be diced. The wafer W may be diced using the same as or different from the method of dicing the first carrier 11. For example, as previously described, when the first carrier 11 is diced using laser, the wafer W may also be diced using laser. Alternatively, the wafer W may be diced using a blade or plasma.

As the adhesive portion 62 of the dicing member 60 is deformed, the wafer assembly can be completely separated into a plurality of die-carrier assemblies. Referring to one or more example embodiments shown in FIG. 6, the adhesive portion 62 may be stretched by driving a frame portion 61 of the dicing member 60. Accordingly, the wafer assembly can be completely separated into the plurality of die-carrier assemblies. For example, when the plurality of through-holes TH (refer to FIG. 5) are formed in the first carrier 11, the first carrier 11 can be completely separated into the plurality of carrier pieces through deformation of the adhesive portion 62. Meanwhile, in FIG. 6, the adhesive portion 62 is shown to be stretched and deformed, one or more example embodiments are not limited to this, and the adhesive portion 62 may be deformed into a bent shape by driving of the frame portion 61.

After the wafer assembly is completely separated into the plurality of die-carrier assemblies DCA, each of the plurality of die-carrier assemblies DCA may be picked and disposed in a target substrate TS (S30).

Figure 7:
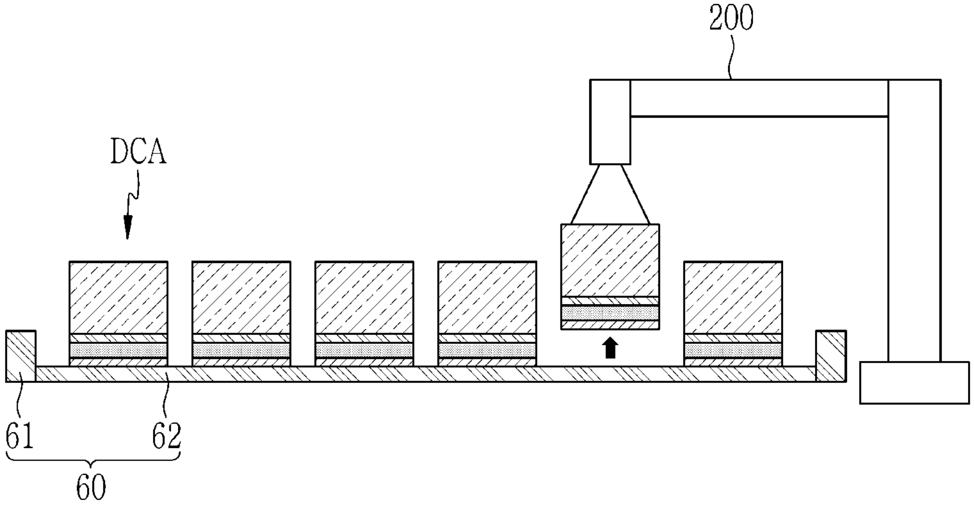

Referring to one or more example embodiments shown in FIG. 7, each die-carrier assembly DCA may be picked using a picking device 200. For example, the picking device 200 may be provided with an adsorption member at an end and may pick each die-carrier assembly DCA. According to one or more example embodiments, the picking device 200 may adsorb and handle the carrier piece CP in the die-carrier assembly DCA. Accordingly, because there is no need to directly adsorb the die D, the die D can be easily handled without causing deformation or damage to the die D with a thin thickness (e.g., thickness of 30 μm or less).

Figure 8:
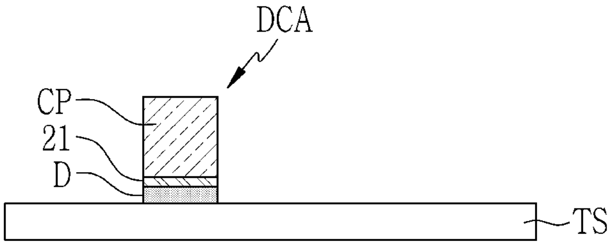

Referring to one or more example embodiments shown in FIG. 8, the die-carrier assembly DCA may be disposed in the target substrate TS. According to one or more example embodiments, the die-carrier assembly DCA may be disposed on the target substrate TS without being separated. Accordingly, one side of the die D may be connected with the target substrate TS and the carrier piece CP may be disposed on the other side of the die D in the die-carrier assembly DCA.

For example, a metal pad for electrical connection may be exposed to one side of the die D disposed on the target substrate TS in the die-carrier assembly DCA. Accordingly, the die D and the target substrate TS may be electrically connected with each other. For example, the die-carrier assembly DCA is disposed on the target substrate TS and a separate electrical connection member is connected between the die D and the target substrate TS such that the die D can be mounted to the target substrate TS.

Each of the plurality of die-carrier assemblies DCA is disposed on the target substrate TS and then the plurality of die-carrier assemblies are irradiated with light to separate the carrier piece CP from each of the plurality of die-carrier assemblies (S40).

Figure 9:
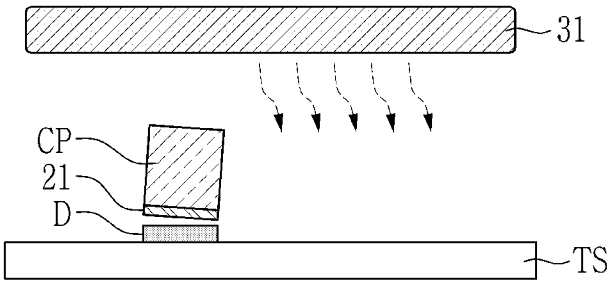

Referring to one or more example embodiments shown in FIG. 9, light may be radiated toward the die-carrier assembly DCA disposed on the target substrate TS. According to one or more example embodiments, first light is radiated toward the die-carrier assembly DCA disposed on the target substrate TS using a first light source 31 to thereby separate the carrier piece CP from the die-carrier assembly DCA.

For example, the carrier piece CP may transmit the first light in the die-carrier assembly DCA. In addition, in the die-carrier assembly DCA, the first adhesive member 21 between the die D and the carrier piece CP may lose adherence or adherence may be weakened due to reaction to the first light. The first light may weaken the adherence of the first adhesive member 21 by penetrating the carrier piece CP. Accordingly, after the first light is radiated to the die-carrier assembly DCA from the first light source 31, the carrier piece CP can be separated.

Although it is not illustrated, when the carrier piece CP is separated, the carrier piece CP can be lifted using an absorption pad. For example, when the adherence of the first adhesive member 21 is weakened, the carrier piece CP may be easily separated by lifting the carrier piece CP at an angle from the edge. Although it is illustrated in FIG. 9 that only one light is radiated to one die-carrier assembly DCA, but a plurality of die-carrier assemblies DCA may be disposed on the target substrate TS.

Meanwhile, when light is radiated toward the die-carrier assembly DCA disposed on the target substrate TS, various methods may be used.

Figure 10:
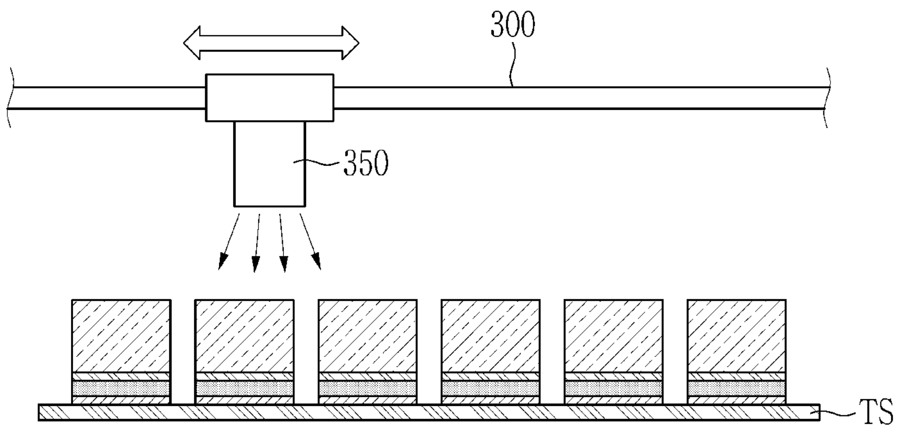
FIG. 10 and FIG. 11 are provided for description of a method for radiating light in a semiconductor package manufacturing method according to one or more example embodiments.
Figure 11:
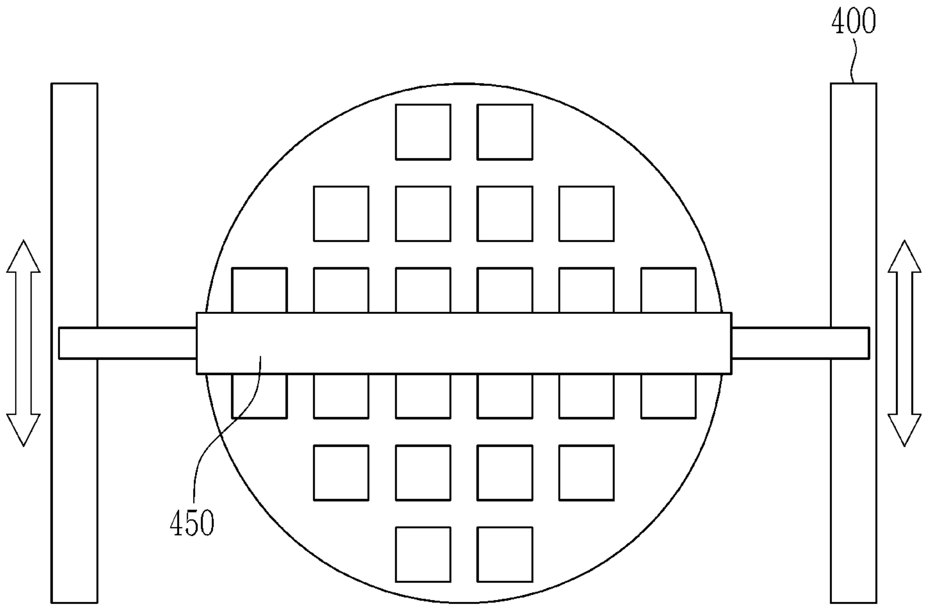

FIG. 10 and FIG. 11 are provided for description of a method for radiating light in a semiconductor package manufacturing method according to one or more example embodiments. FIG. 10 is a cross-sectional view, and FIG. 11 is a top plan view.

Referring to one or more example embodiments shown in FIG. 10, light (e.g., first light or second light in the present specification) may be radiated to the die-carrier assembly DCA using a light irradiation device 300. The light irradiation device 300 shown in FIG. 10 may radiate light to the die-carrier assembly DCA using a method of radiating light locally to an individual die-carrier assembly DCA. The light irradiation portion 350 is provided to be movable and can radiate light by moving a position of a die-carrier assembly DCA where light irradiation is required. The light irradiation device 300 using such a local irradiation method has the merit of avoiding the influence of parts other than the die-carrier assembly DCA that requires light irradiation.

Referring to one or more example embodiments shown in FIG. 11, another type of light irradiation device 400 may have a structure in which a light irradiation portion 450 extends longer than a diameter of a target substrate TS and moves along a guide rail. Accordingly, through a scan method, light can be radiated to the die-carrier assembly DCA that requires light irradiation. Such a scan-type light irradiation device 400 has the merit of reducing work time because it can simultaneously irradiate the plurality of die-carrier assemblies DCA with light.

However, the above-described light irradiation method is illustrative, but embodiments of the disclosure are not limited thereto. In addition, light can be radiated to the die-carrier assembly DCA through various methods and devices. For example, light irradiation may be performed through a device in which a plurality of light sources corresponding to the number of die-carrier assemblies DCAs requiring light irradiation are arranged. Alternatively, light irradiation may be performed by simultaneously the entire plurality of die-carrier assemblies DCA with light through a light source in a large area.

The semiconductor package manufacturing method of one or more example embodiments described above can be applied to heterogeneous integration packaging in which a plurality of semiconductor devices of various types and sizes are mounted and packaged on one substrate. When a particularly thin semiconductor device is included, the packaging process can be easily performed.

Recently, a 3D packaging method that vertically stacks a plurality of semiconductor devices has been used, and packaging can be performed by stacking a plurality of semiconductor devices using a hybrid bonding method. A semiconductor package manufacturing method of one or more example embodiments, described below with different drawings, may be applied to packaging using a 3D hybrid bonding method.

FIGS. 12, 13, 14, 15, 16, 17, 18, 19, 20 and 21 are provided for description of a semiconductor package manufacturing method according to one or more example embodiments. FIGS. 12, 13, 14, 15, 16, 17, 18, 19, 20 and 21 are cross-sectional views.

Figure 12:
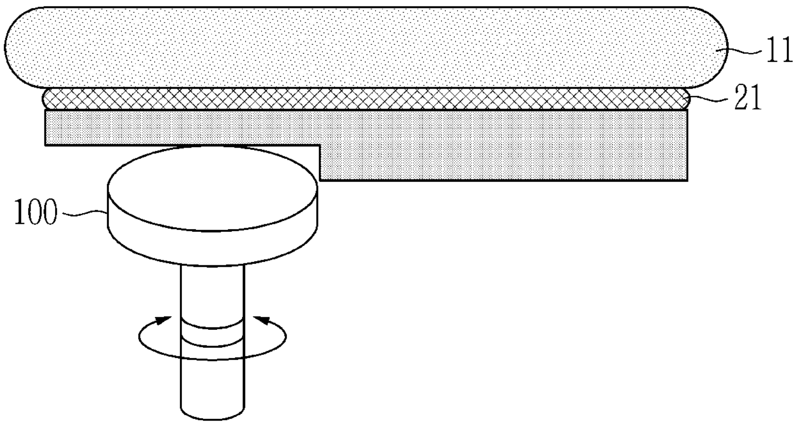
FIGS. 12, 13, 14, 15, 16, 17, 18, 19, 20 and 21 are provided for description of a semiconductor package manufacturing method according to one or more example embodiments.

Referring to one or more example embodiments shown in FIG. 12, a first carrier 11 is bonded to one side of a wafer W. According to one or more example embodiments, a first adhesive member 21 is disposed between the first carrier 11 and the wafer W to bond the wafer W and the first carrier 11.

According to one or more example embodiments, the first carrier 11 may include a material that transmits first light. The first adhesive member 21 may be attached to the first carrier 11 in the form of a tape or positioned on the first carrier 11 in the form of a paste through a method such as spin coating.

According to one or more example embodiments, the first adhesive member 21 may react to the first light and weaken adherence. Accordingly, the adherence of the first adhesive member 21 may be weakened or the adherence may be lost by being irradiated with the first light. For example, the first light may include UV light or IR light. Additionally, the first adhesive member 21 may include UV release tape or UV release paste that loses or weakens adherence in response to UV light. Alternatively, the first adhesive member 21 may include thermal release tape or thermal release paste that reacts with IR light or heat corresponding to IR light.

However, the first carrier 11 may be formed of a material that does not transmit light, and according to one or more example embodiments, the first adhesive member 21 may not be formed of a material that reacts with light.

Referring to one or more example embodiments shown in FIG. 12, a side opposite to the side of the wafer W, to which the first carrier 11 is bonded may be grinded. Accordingly, a thickness of wafer W can be processed to be thin. For example, the grinding may be carried out through a chemical mechanical polishing device (CMP) 100.

After the grinding, semiconductor processes such as photo, etching, deposit, and metal line processes may be performed on the side (the grinded side) of the wafer W.

Figure 13:
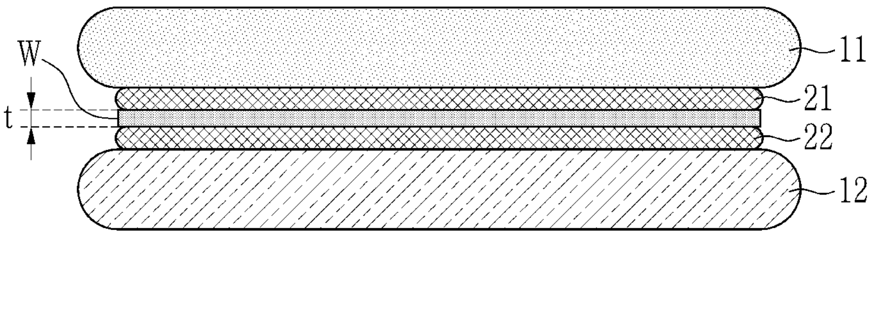

Referring to one or more example embodiments shown in FIG. 13, a second carrier 12 including a material that transmits light may be bonded to the side (the grinded side) of the wafer. According to one or more example embodiments, before a dicing process is carried out, a thickness t of the wafer W to which the second carrier 12 is bonded may be 30 μm or less.

According to one or more example embodiments, a second adhesive member 22 may be disposed between the second carrier 12 and the wafer W to bond the wafer W and the second carrier 12.

According to one or more example embodiments, the second carrier 12 may include a material that transmits second light. The second adhesive member 22 may be attached to the second carrier 12 in the form of a tape or may be positioned on the second carrier 12 in the form of a paste through a method such as spin coating.

According to one or more example embodiments, the second adhesive member 22 may react with the second light and may weaken adherence. Accordingly, by irradiating the second adhesive member 22 with the second light, the adherence of the second adhesive member 22 may be weakened or the adherence may be lost. For example, the second light may include UV light or IR light. In addition, the second adhesive member 22 may include UV release tape or UV release paste that loses or weakens adherence in response to UV light. Alternatively, the second adhesive member 22 may include thermal release tape or thermal release paste that reacts with IR light or heat corresponding to IR light.

According to one or more example embodiments, the first carrier 11 and the second carrier 12 may include the same material. For example, the first carrier 11 and the second carrier 12 may include a material that transmits the same line. In addition, the first adhesive member 21 and the second adhesive member 22 may include the same material. For example, the first adhesive member 21 and the second adhesive member 22 may include a material that loses adherence or weakens adherence in response to the same light. In addition, according to one or more example embodiments, the first light and the second light may be the same light with the same wavelength range.

Figure 14:
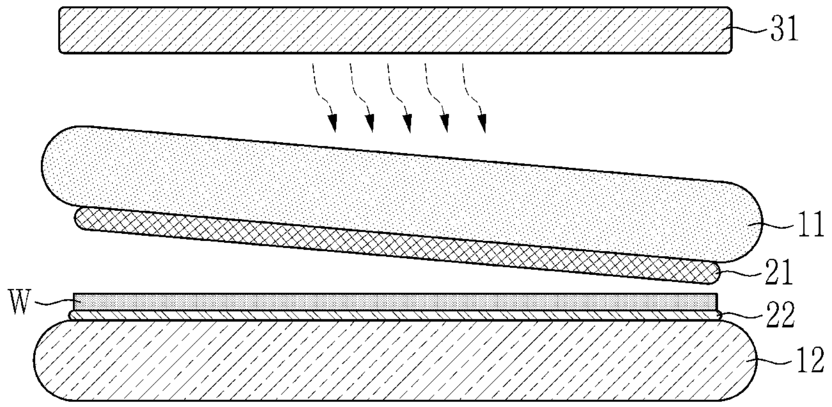

Referring to one or more example embodiments shown in FIG. 14, the first carrier 11 may be removed using the first light source 31 to irradiate the first adhesive member 21 with the first light. For example, the first adhesive member 21 between the wafer W and the first carrier 11 may react to the first light and weaken adherence, and thus the first carrier 11 can be easily removed.

After the first carrier 11 is removed, the wafer W to which the second carrier 12 is bonded may be separated into a plurality of die-carrier assemblies by dicing it together with the second carrier 12. Similar to the previous one or more example embodiments, in one or more example embodiments, a wafer W structure to which the second carrier 12 is bonded is defined as a wafer assembly. In addition, a structure in which the carrier piece CP (of the second carrier 12) is bonded to the die D is defined as a die-carrier assembly.

According to one or more example embodiments, the wafer assembly may be separated into a plurality of die-carrier assemblies using at least one of a blade, a laser, and plasma. In the wafer assembly, the second carrier 12 and the wafer W may be diced using the same method or a different method.

Figure 15:
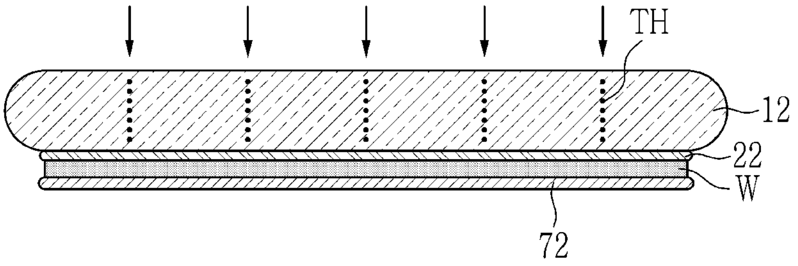

For example, referring to one or more example embodiments shown in FIG. 15, when the second carrier 12 includes a glass material, the second carrier 12 may be diced using a laser. A plurality of through-holes TH may be formed on the second carrier 12 using laser ablation. The plurality of through-holes TH may be formed along a path DL (refer to FIG. 5) to be diced, and the second carrier 12 may remain in a state of not being completely separated from the plurality of carrier pieces CP. Additionally, for convenience in separating the second carrier 12, an etching solution (etchant) may be sprayed to the second carrier 12 to perform an etching process. As another example, the second carrier 12 may be diced using a blade or plasma.

Referring to one or more example embodiments shown in FIG. 15, before performing dicing of the second carrier 12, semiconductor processes such as photo, etching, deposit, and metal line process may be performed on an exposed side (i.e., a side to which the first carrier 11 was bonded) of the wafer W. According to one or more example embodiments, a metal line or a metal pad may be placed on both sides of the die D that is ultimately placed on the target substrate TS. As shown in FIG. 15, the exposed side (the side where the first carrier 11 was bonded) of the wafer W may be covered with a second protective tape 72.

Figure 16:
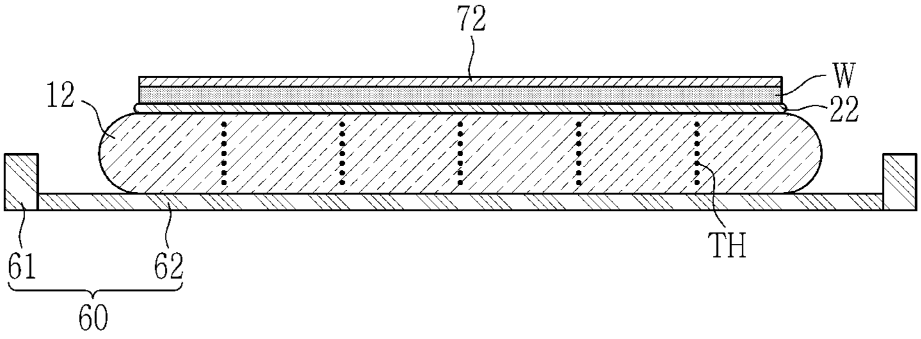

Referring to one or more example embodiments shown in FIG. 16, the wafer assembly may be positioned on the dicing member 60. The dicing member 60 may include a frame portion 61 and an adhesive portion 62, and the adhesive portion 62 may have adhesiveness and elasticity. For example, the second carrier 12 of the wafer assembly may be attached to the elastic adhesive portion 62.

Figure 17:
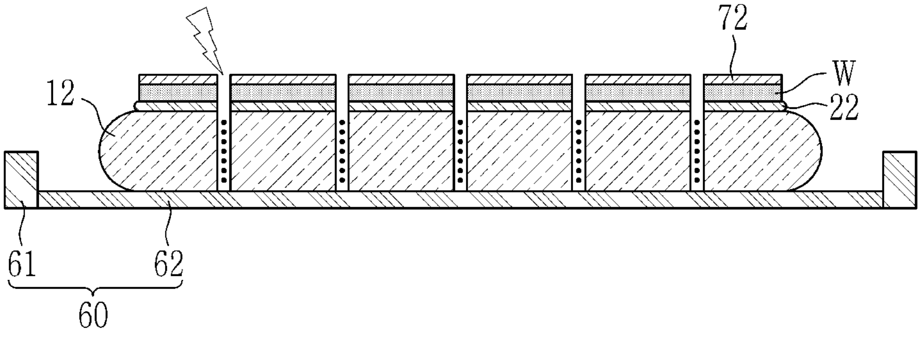

Referring to one or more example embodiments shown in FIG. 17, the wafer W may be diced with a plurality of dies D in the wafer assembly positioned on the dicing member 60. The wafer W may also be diced using the laser previously used in the second carrier 12. Alternatively, the wafer W may be diced using a blade or plasma.

Figure 18:
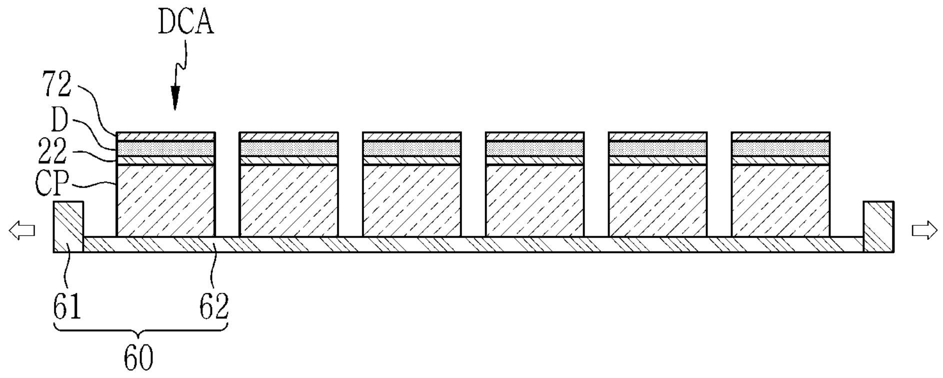

Referring to one or more example embodiments shown in FIG. 18, the adhesive portion 62 may be stretched by driving the frame portion 61 of the dicing member 60. Accordingly, the wafer assembly can be completely separated into the plurality of die-carrier assemblies DCA. For example, when a plurality of through-holes TH are formed in the second carrier 12, the second carrier 12 may be completely separated into a plurality of carrier pieces through deformation of the adhesive portion 62. According to one or more example embodiments, in FIG. 18, the adhesive portion 62 is shown to be stretched and deformed. However, one or more example embodiments are not limited to this example, and the adhesive portion 62 may be deformed into a bent shape by driving of the frame portion 61.

After the wafer assembly is completely separated into the plurality of die-carrier assemblies DCA, each of the plurality of die-carrier assemblies DCA may be picked and disposed in a target substrate TS.

Figure 19:
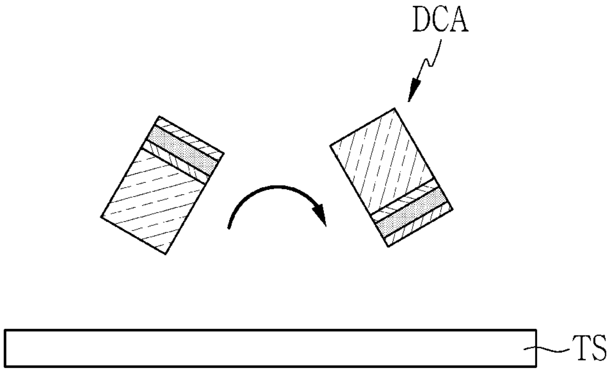

Referring to one or more example embodiments shown in FIG. 19, in one or more example embodiments, when the die-carrier assembly DCA is disposed on the target substrate TS, the die-carrier assembly DCA may be flipped such that the die D of the die-carrier assembly DCA faces the target substrate TS.

Figure 20:
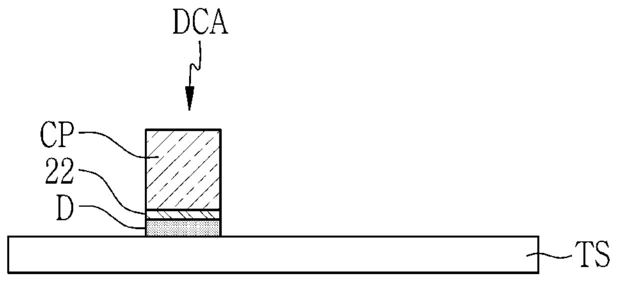

Referring to one or more example embodiments shown in FIG. 20, the die-carrier assembly DCA may be disposed on the target substrate TS. According to one or more example embodiments, the die-carrier assembly DCA may be placed on the target substrate TS without being separated. Accordingly, in the die-carrier assembly DCA, the target substrate TS may be connected to one side of the die D, and the carrier piece CP may be positioned on the other side of the die D.

Figure 21:
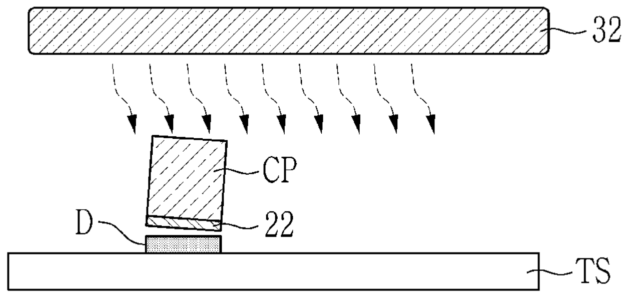

Referring to one or more example embodiments shown in FIG. 21, after the die-carrier assembly DCA is disposed on the target substrate TS, light may be radiated to separate the carrier piece CP from the die-carrier assembly DCA.

According to one or more example embodiments, second light is radiated toward the die-carrier assembly DCA disposed on the target substrate TS using a second light source 32 such that the carrier piece CP can be separated from the die-carrier assembly DCA.

For example, the carrier piece CP may transmit the second light in the die-carrier assembly DCA. In addition, the second adhesive member 22 between the die D and the carrier piece CP may react to the second light and may lose or weaken adherence in the die-carrier assembly DCA. The second light may penetrate the carrier piece CP to weaken the adherence of the second adhesive member 22. Accordingly, after irradiating the die-carrier assembly DCA with the second light from the second light source 32, the carrier piece CP can be easily separated.

According to one or more example embodiments, after removing the carrier piece CP from the die-carrier assembly DCA, the remaining second adhesive member 22 can be completely removed from the surface of the die D through a cleaning process. After that, other dies can be sequentially stacked on the die D using a hybrid bonding method to form a 3D stacking structure.

According to one or more example embodiments, because the die can be handled with the carrier bonded, warpage of the die can be reduced when handling a thin die.

In addition, because the carrier can be easily separated by irradiating light, the semiconductor packaging process and equipment can be simplified.

While one or more example embodiments have been particularly shown and described above, it will be apparent to those skilled in the art that various changes in form and details may be made to one or more example embodiments without departing from the spirit and scope of the following claims.

What is claimed is:

1. A semiconductor package manufacturing method comprising:

bonding a carrier to a wafer;

dicing the wafer together with the carrier which is bonded to the wafer into a plurality of die-carrier assemblies, each of the plurality of die-carrier assemblies comprising a die and a carrier piece bonded to the die;

disposing the plurality of die-carrier assemblies on a target substrate; and separating the carrier pieces from the plurality of die-carrier assemblies by irradiating the plurality of die-carrier assemblies with light.

2. The semiconductor package manufacturing method of claim 1, wherein the bonding the carrier to the wafer comprises bonding the carrier to the wafer using an adhesive member disposed between one side of the wafer and the carrier.

3. The semiconductor package manufacturing method of claim 2, wherein adherence of the adhesive member is weakened by the light.

4. The semiconductor package manufacturing method of claim 2, wherein, in the separating the carrier piece, the light penetrates the carrier piece and weakens adherence of the adhesive member.

5. The semiconductor package manufacturing method of claim 1, wherein the dicing the wafer comprises using at least one of a blade, a laser, or plasma to dice the wafer.

6. The semiconductor package manufacturing method of claim 1, wherein the carrier comprises a material configured to transmit the light.

7. The semiconductor package manufacturing method of claim 1, further comprising, before the dicing into the plurality of die-carrier assemblies, grinding a side of the wafer, opposite to a side at which the carrier is bonded.

8. The semiconductor package manufacturing method of claim 1, further comprising:

before the bonding the carrier, bonding a first carrier to a side of the wafer, opposite to a side at which the carrier is bonded; and after the bonding the carrier, separating the first carrier from the wafer by irradiating the first carrier and the wafer with the light.

9. The semiconductor package manufacturing method of claim 1, wherein the carrier comprises glass, and wherein the dicing into the plurality of die-carrier assemblies comprises providing, using a laser, a plurality of through-holes along a path to be diced on the carrier.

10. The semiconductor package manufacturing method of claim 1, wherein the disposing each of the plurality of die-carrier assemblies on the target substrate comprises:

for each of the plurality of die-carrier assemblies, connecting the target substrate to one side of the die and disposing the carrier piece on another side of the die.

11. The semiconductor package manufacturing method of claim 1, wherein the providing each of the plurality of die-carrier assemblies on the target substrate comprises absorbing and handling the carrier piece of each of the plurality of die-carrier assemblies.

12. The semiconductor package manufacturing method of claim 1, wherein a thickness of the die of each of the plurality of die-carrier assemblies is about 30 μm or less.

13. A semiconductor package manufacturing method comprising:

bonding a carrier to a front side of a wafer, the carrier comprising a material configured to transmit light;

grinding a rear side of the wafer that is opposite to the front side of the wafer;

dicing the wafer together with the carrier which is bonded to the wafer into a plurality of die-carrier assemblies, each of the plurality of die-carrier assemblies comprising a die and a carrier piece bonded to the die;

disposing the plurality of die-carrier assemblies on a target substrate; and separating the carrier pieces from the plurality of die-carrier assemblies by irradiating the plurality of die-carrier assemblies with light.

14. The semiconductor package manufacturing method of claim 13, wherein the bonding the carrier comprises bonding the carrier to the front side of the wafer by placing an adhesive member between the front side of the wafer and the carrier, and wherein adherence of the adhesive member is weakened by the light.

15. The semiconductor package manufacturing method of claim 13, wherein the dicing comprises attaching the rear side of the wafer to a flexible dicing member and then dicing the wafer.

16. A semiconductor package manufacturing method comprising:

bonding a first carrier to a first side of a wafer;

grinding a second side of the wafer, which is opposite to the first side of the wafer;

bonding a second carrier to the second side of the wafer, the second carrier comprising a material configured to transmit light;

removing the first carrier;

dicing the wafer together with the second carrier which is bonded to the wafer into a plurality of die-carrier assemblies, each of the plurality of die-carrier assemblies comprising a die and a carrier piece bonded to the die;

disposing the plurality of die-carrier assemblies on a target substrate; and separating the carrier pieces from the plurality of die-carrier assemblies by irradiating the plurality of die-carrier assemblies with light.

17. The semiconductor package manufacturing method of claim 16, wherein the first carrier comprises a material configured to transmit a first light, and wherein the semiconductor package manufacturing method further comprises disposing a first adhesive member between the first side of the wafer and the first carrier, the first adhesive member being configured to react with the first light and weaken adherence.

18. The semiconductor package manufacturing method of claim 16, wherein the bonding the second carrier comprises disposing an adhesive member between the second side of the wafer and the second carrier, the adhesive member being configured to react with the light and weaken adherence.

19. The semiconductor package manufacturing method of claim 16, wherein the dicing comprises:

using a laser to form a plurality of through-holes along a path to be diced on the second carrier;

attaching a flexible dicing member to the second carrier;

dicing the wafer into a plurality of dies; and separating the second carrier into a plurality of carrier pieces along the path.

20. The semiconductor package manufacturing method of claim 16, further comprising, after the separating the carrier pieces, stacking other dies on the die.

* * * * *